(12) United States Patent
Yi et al.

(10) Patent No.: US 10,636,856 B2
(45) Date of Patent: Apr. 28, 2020

(54) AMOLED DOUBLE-SIDE DISPLAY

(71) Applicant: Wuhan China Star Optoelectronics Technology Co., Ltd., Wuhan (CN)

(72) Inventors: Shijuan Yi, Wuhan (CN); Shuang Li, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 349 days.

(21) Appl. No.: 15/505,098

(22) PCT Filed: Dec. 27, 2016

(86) PCT No.: PCT/CN2016/112248
§ 371 (c)(1),
(2) Date: Feb. 20, 2017

(87) PCT Pub. No.: WO2018/090440
PCT Pub. Date: May 24, 2018

(65) Prior Publication Data
US 2019/0157371 A1 May 23, 2019

(30) Foreign Application Priority Data
Nov. 17, 2016 (CN) .......................... 2016 1 1032735

(51) Int. Cl.
*H01L 27/32* (2006.01)
*H01L 51/52* (2006.01)
(Continued)

(52) U.S. Cl.
CPC ....... *H01L 27/3267* (2013.01); *G09G 3/3225* (2013.01); *H01L 27/3244* (2013.01);
(Continued)

(58) Field of Classification Search
CPC ................................................... H01L 27/3267
See application file for complete search history.

(56) References Cited

U.S. PATENT DOCUMENTS

2007/0114916 A1* 5/2007 Chang ................. H01L 27/3209
313/504
2007/0164660 A1* 7/2007 Hu ...................... H01L 27/3267
313/500
(Continued)

FOREIGN PATENT DOCUMENTS

CN 103730484 A 4/2014

*Primary Examiner* — Walter H Swanson
(74) *Attorney, Agent, or Firm* — Leong C. Lei (57) ABSTRACT

The invention discloses an AMOLED doubled-sided display, with the OLED array layer comprising a plurality of top-emitting OLED units and a plurality of bottom-emitting OLED units arranged in an array, wherein the top emitting and bottom-emitting OLED units being arranged alternatingly in at least one of the horizontal direction or vertical direction; the top-emitting and bottom-emitting OLED units having different thickness for respective anodes and cathodes, to realize the top-emitting characteristics of the top-emitting OLED units and the bottom-emitting characteristics of the bottom-emitting OLED units; as such, by designing an algorithm for a single IC to control image displaying, only a display panel and a control IC are sufficient to achieve double-sided displaying, and able to ensure an observer standing in front of the display panel will not see mirrored image or directional distorted image, as well as achieve low-cost and quality display result.

8 Claims, 7 Drawing Sheets

(51) Int. Cl.
*H01L 51/56* (2006.01)
*G09G 3/3225* (2016.01)
*H01L 51/50* (2006.01)

(52) U.S. Cl.
CPC .......... *H01L 51/50* (2013.01); *H01L 51/5218* (2013.01); *H01L 51/5234* (2013.01); *H01L 51/56* (2013.01); *G09G 2300/02* (2013.01); *G09G 2300/0439* (2013.01); *G09G 2320/0686* (2013.01); *H01L 2251/533* (2013.01); *H01L 2251/5315* (2013.01); *H01L 2251/5323* (2013.01)

(56) References Cited

U.S. PATENT DOCUMENTS

| | | | |
|---|---|---|---|
| 2013/0193843 A1* | 8/2013 | Yan | H05B 33/22 313/504 |
| 2015/0001519 A1* | 1/2015 | Matsuura | H01L 33/38 257/40 |
| 2016/0268362 A1* | 9/2016 | Shi | H01L 27/3267 |

* cited by examiner

Fig. 8

AMOLED DOUBLE-SIDE DISPLAY

BACKGROUND OF THE INVENTION

1. Field of the Invention

The present invention relates to the field of display techniques, and in particular to an AMOLED double-sided display.

2. The Related Arts

The active-matrix organic light emitting diode (AMOLED) display provides the advantages of active light-emitting, low driving voltage, high emission efficiency, quick response time, high resolution and contrast, wide viewing angle, wide operation temperature range, and capability to realize flexible display and large-area full-color display, and is regarded as the most promising display technology. The AMOLED is a self-luminous type display, wherein the OLED device usually comprises the pixel electrode and the common electrode operating respectively on the anode and the cathode, and the organic functional layers disposed between the pixel electrode and the common electrode. When a current flowing through, these functional layers will emit light.

With the development of display technology, the demands from the consumers on the display, other than fast response, high resolution and fine display, also include the pursuit of the breakthrough in functions and display modes. Therefore, AMOLED double-sided display device came into existence. The AMOLED double-sided display, in addition to common AMOLED display features, can also extend the screen space, fast switching and processing of a plurality of screens, and have a huge application potential in advertisement promotion and portable products.

Figure 1:
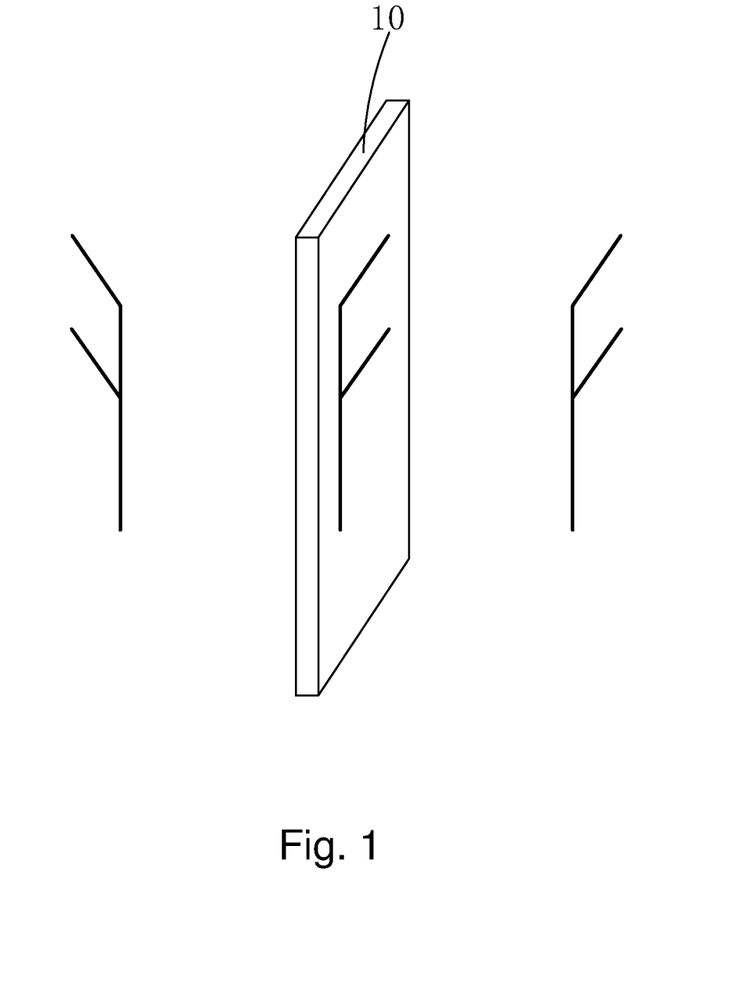
FIG. 1 is a schematic view showing a double-sided displaying effect by a known AMOLED double-sided display.

At present, the common design of the AMOLED double-sided display usually adopts a technique to make the anode and the cathode thin and transparent so that the OLED device can display simultaneously on the front and back sides of the panel. However, an obvious disadvantage in this design is that the image displayed on the back side of the panel is a mirrored image of the front side of the panel. That is, the observer on the opposite sides of the panel sees the opposite image. As shown in FIG. 1, the AMOLED display 10 adopts the above design, and when the observer stands on the right, the observer sees an F displayed on the front side of the AMOLED display screen 10; when the observer is on the left, the observer sees a flipped F displayed on the front side of the AMOLED display screen 10, which results in great inconvenience, especially when a map type of image is displayed, the disadvantage is even more prominent.

Figure 2:
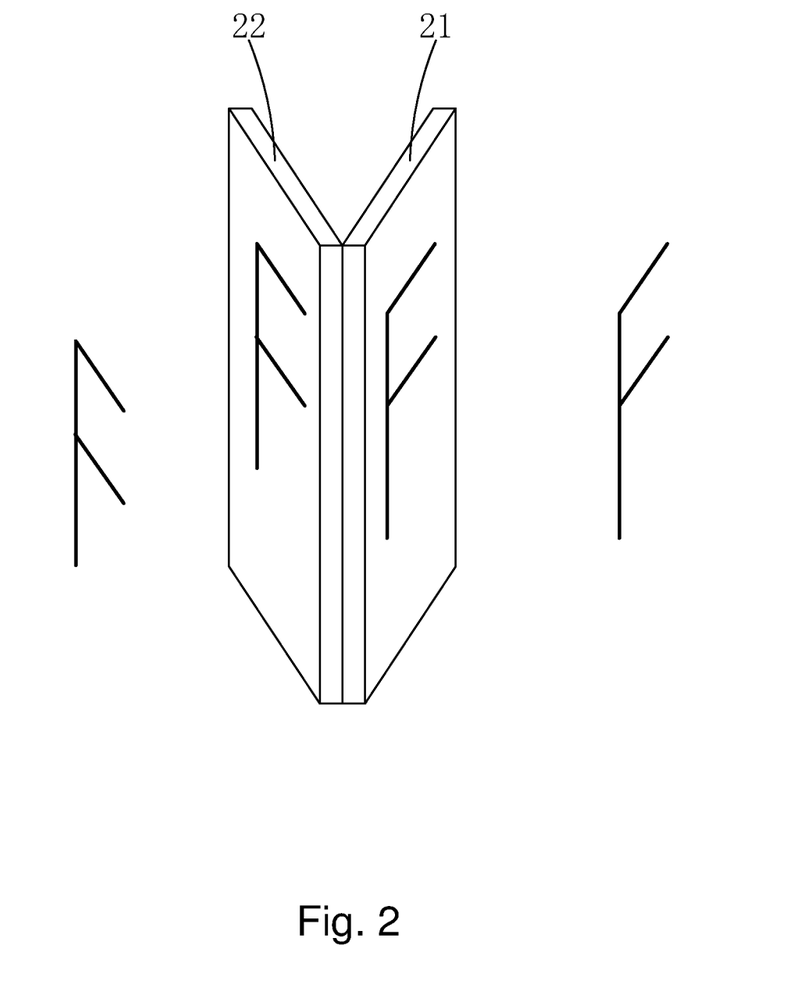
FIG. 2 is a schematic view showing a double-sided displaying effect by another known AMOLED double-sided display.

Another common technique in the AMOLED double-sided display design is to attach the two top-emitting AMOLED panels together, and signals are transmitted through two integrated circuits (ICs) respectively so that no directional distortion of the image displayed on the front and back sides will occur. As shown in FIG. 2, an AMOLED double-sided display screen employing the above design comprises: a first AMOLED panel 21 and a second AMOLED panel 22, which are attached back-to-back together. The observer standing on the right sees an F displayed on the first AMOLED panel 21; and the observer standing on the left also sees an F displayed on the second AMOLED panel 22. However, the obvious drawbacks of such a design include: the need for two AMOLED panels, and the two separate ICs controlling the respective AMOLED panel, the relatively heavy structure, the relatively complex process, high production costs, not meeting consumer expectations of thinness and valuable cost/performance.

SUMMARY OF THE INVENTION

The object of the present invention is to provide an AMOLED double-sided display, requiring only a display panel and a control IC to effectively realize double-sided displaying, and able to ensure an observer standing in front of the display panel will not see mirrored image or directional distorted image, as well as achieve low-cost and quality display result.

To achieve the above object, the present invention provides an AMOLED double-sided display, which comprises: a substrate, and an OLED array layer disposed on the substrate;

the OLED array layer comprising a plurality of top-emitting OLED units and a plurality of bottom-emitting OLED units arranged in an array, wherein the top emitting OLED units and the bottom-emitting OLED units being arranged alternatingly in at least one of the horizontal direction or vertical direction;

the top-emitting OLED unit and the bottom-emitting OLED unit both comprising an anode, an organic layer and a cathode from the bottom up in a stack structure;

the anode of the top-emitting OLED unit and the anode of the bottom-emitting OLED unit being the first anode and the second anode respectively, the first anode being thicker than the second anode, the first anode being reflective and the second cathode being light-transmissive;

the cathode of the top-emitting OLED unit and the cathode of the bottom-emitting OLED unit being the first cathode and the second cathode respectively, the second cathode being thicker than the first cathode, the first cathode being light-transmissive and the second cathode being reflective.

According to a preferred embodiment of the present invention, the first anode and the second anode are formed respectively by two vacuum evaporation processes with mask.

According to a preferred embodiment of the present invention, the first anode and the second anode are formed by the same vacuum evaporation process with a grey-tone, or a half-tone mask.

According to a preferred embodiment of the present invention, the OLED array layer comprises a first cathode film and a second cathode film, and the second cathode film is formed on an upper surface of the first cathode film corresponding to the plurality of bottom-emitting OLED units by a vacuum evaporation process with a mask;

the first cathode is formed by a part of the first cathode film corresponding to the top-emitting OLED unit, and the second cathode is formed by a part of the first cathode film and the second cathode film corresponding to the bottom-emitting OLED unit.

Optionally, in the OLED array layer, the top-emitting OLED units and the bottom-emitting units are alternatingly arranged in both the horizontal and vertical directions;

the plurality of top-emitting OLED units and the plurality of bottom-emitting OLED units together form an OLED unit array, wherein the top-emitting OLED units and the bottom-emitting OLED units are arranged alternatingly in each row and each column.

According to a preferred embodiment of the present invention, during displaying, in the OLED unit array, for a positive integer i, the i-th top-emitting OLED unit from left in each row receives the same image signal as the i-th bottom-emitting OLED unit from right in the same row.

Optionally, in the OLED array layer, the top-emitting OLED units and the bottom-emitting units are alternatingly arranged in the horizontal direction but not in the vertical direction;

the plurality of top-emitting OLED units and the plurality of bottom-emitting OLED units together form an OLED unit array, wherein each odd-numbered column comprises the top-emitting OLED units and each even-numbered column comprises the bottom-emitting OLED units;

or, each odd-numbered column comprises the bottom-emitting OLED units and each even-numbered column comprises the top-emitting OLED units.

According to a preferred embodiment of the present invention, during displaying, in the OLED unit array, for a positive integer i, the i-th top-emitting OLED unit from left in each row receives the same image signal as the i-th bottom-emitting OLED unit from right in the same row.

Optionally, in the OLED array layer, the top-emitting OLED units and the bottom-emitting units are alternatingly arranged in the vertical direction but not in the horizontal direction;

the plurality of top-emitting OLED units and the plurality of bottom-emitting OLED units together form an OLED unit array, wherein each odd-numbered row comprises the top-emitting OLED units and each even-numbered row comprises the bottom-emitting OLED units;

or, each odd-numbered row comprises the bottom-emitting OLED units and each even-numbered row comprises the top-emitting OLED units.

According to a preferred embodiment of the present invention, during displaying, in the OLED unit array, for positive integers i and j, the j-th top-emitting OLED unit in the i-th column from left receives the same image signal as the j-th bottom-emitting OLED unit in the i-th column from right.

Another embodiment of the present invention provides an AMOLED double-sided display, which comprises: a substrate, and an OLED array layer disposed on the substrate; the OLED array layer comprising a plurality of top-emitting OLED units and a plurality of bottom-emitting OLED units arranged in an array, wherein the top emitting OLED units and the bottom-emitting OLED units being arranged alternatingly in at least one of the horizontal direction or vertical direction;

the top-emitting OLED unit and the bottom-emitting OLED unit both comprising an anode, an organic layer and a cathode from the bottom up in a stack structure;

the anode of the top-emitting OLED unit and the anode of the bottom-emitting OLED unit being the first anode and the second anode respectively, the first anode being thicker than the second anode, the first anode being reflective and the second cathode being light-transmissive;

the cathode of the top-emitting OLED unit and the cathode of the bottom-emitting OLED unit being the first cathode and the second cathode respectively, the second cathode being thicker than the first cathode, the first cathode being light-transmissive and the second cathode being reflective;

wherein the first anode and the second anode being formed respectively by two vacuum evaporation processes with mask;

wherein the OLED array layer comprising a first cathode film and a second cathode film, and the second cathode film being formed on an upper surface of the first cathode film corresponding to the plurality of bottom-emitting OLED units by a vacuum evaporation process with a mask;

the first cathode being formed by a part of the first cathode film corresponding to the top-emitting OLED unit, and the second cathode being formed by a part of the first cathode film and the second cathode film corresponding to the bottom-emitting OLED unit.

Compared to the known techniques, the present invention provides the following advantages. The present invention provides an AMOLED double-sided display, which comprises: a substrate, and an OLED array layer disposed on the substrate; the OLED array layer comprising a plurality of top-emitting OLED units arranged in an array, and a plurality of bottom-emitting OLED units arranged in an array, wherein the top emitting OLED units and the bottom-emitting OLED units being arranged alternatingly in at least one of the horizontal direction or vertical direction; the top-emitting OLED unit having an anode thicker than bottom-emitting OLED unit, and bottom-emitting OLED unit having a cathode thicker than the top-emitting OLED unit to increase the reflectivity of the anode of the top-emitting OLED unit and the cathode of the bottom-emitting OLED unit to realize the top-emitting characteristics of the top-emitting OLED units and the bottom-emitting characteristics of the bottom-emitting OLED units; as such, by designing an algorithm for a single IC to control image displaying, only a display panel and a control IC are sufficient to achieve double-sided displaying, and able to ensure an observer standing in front of the display panel will not see mirrored image or directional distorted image, as well as achieve low-cost and quality display result.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 3:
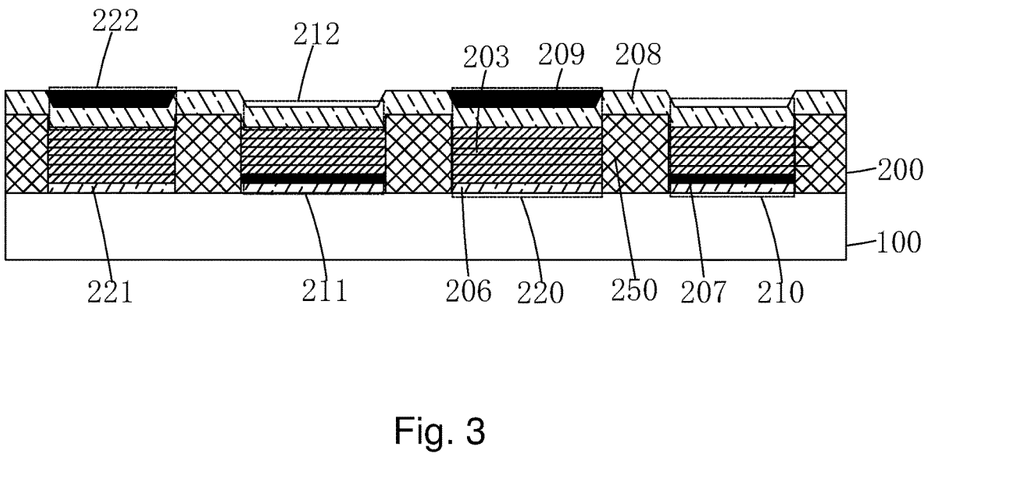
FIG. 3 is a cross-sectional view showing an AMOLED double-sided display provided by an embodiment of the present invention.
Figure 4:
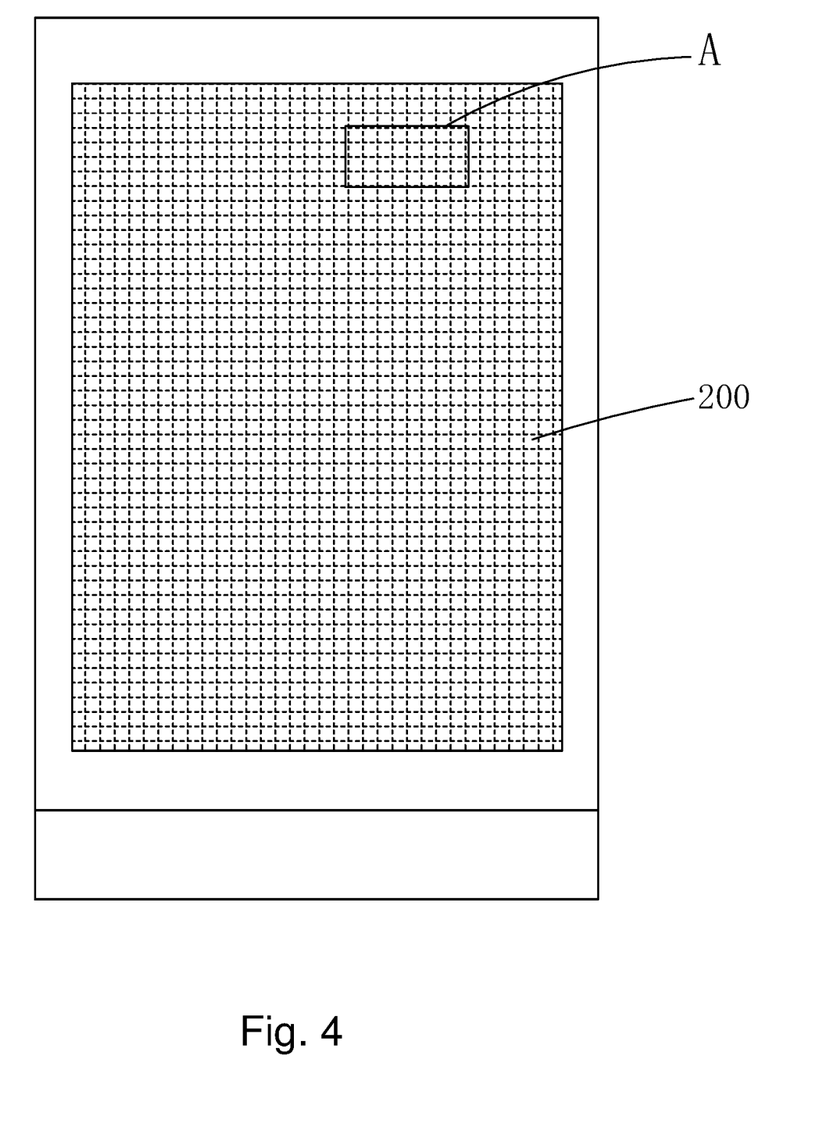
FIG. 4 is a planar view showing an AMOLED double-sided display provided by an embodiment of the present invention.

Referring to FIGS. 3-4, the present invention provides an AMOLED double-sided display, which comprises: a substrate 100, and an OLED array layer 200 disposed on the substrate 100; the OLED array layer 200 comprising a plurality of top-emitting OLED units 210 and a plurality of bottom-emitting OLED units 220 arranged in an array, wherein the top emitting OLED units 210 and the bottom-emitting OLED units 220 being arranged alternatingly in at least one of the horizontal direction or vertical direction.

The top-emitting OLED unit 210 and the bottom-emitting OLED unit 220 both comprise an anode, an organic layer 230 and a cathode from the bottom up in a stack structure.

In the present invention, the anode of the top-emitting OLED unit 210 and the anode of the bottom-emitting OLED unit 220 are the first anode 211 and the second anode 221 respectively, and the first anode 211 is thicker than the second anode 22; the cathode of the top-emitting OLED unit 210 and the cathode of the bottom-emitting OLED unit 220 are the first cathode 212 and the second cathode 222 respectively, the second cathode 222 is thicker than the first cathode 212; as such, the reflectivity of the anode of the top-emitting OLED unit 210 and the cathode of the bottom-emitting OLED unit 220 is enhanced to avoid the light transmittance. As a result, the first anode 211 is reflective and the second node 221 is light-transmissive; the first cathode 212 light-transmissive and the second cathode 222 is reflective, so as to realize the top-emitting characteristics of the top-emitting OLED unit 210 and the bottom-emitting characteristics of the bottom-emitting OLED unit 220. IN the context of the present invention, the terminology "light-transmissive" implies the property of transmitting at least the light generated by the OLED array layer 200, and the terminology "reflective" implies the property of reflecting at least the light generated by the OLED array layer 200.

Specifically, to realize different thickness for the first anode 211 and the second anode 221, the first anode 211 and the second anode 221 are formed respectively by two vacuum evaporation processes with mask; alternatively, the first anode 211 and the second anode 221 are formed by the same vacuum evaporation process with a grey-tone mask, or a half-tone mask. For example, the process can use a mask with pixel pattern to vapor-deposit a thin light-transmissive first anode film 206, and another mask with pixel pattern to vapor-deposit a thicker second anode film 207, which is reflective to prevent light from transmitting, on the first anode film 206 at locations corresponding to top-emitting OLED units 210. As such, the part of the first anode film 206 and the second anode film 207 corresponding to the top-emitting OLED units 210 together forms the first anode 211, and the part of the first anode film 206 corresponding to the bottom-emitting OLED units 220 forms the second anode 221.

Specifically, to realize different thickness for the first cathode 212 and the second cathode 222, the process can use a mask with pixel pattern to vapor-deposit a thin light-transmissive first cathode film 208, and another mask with pixel pattern to vapor-deposit a thicker second cathode film 209, which is reflective to prevent light from transmitting, on the first cathode film 208 at locations corresponding to top-emitting OLED units 210. As such, the part of the first cathode film 208 corresponding to the top-emitting OLED units 210 forms the first cathode 212, and the part of the first cathode film 208 and the second cathode film 209 corresponding to the bottom-emitting OLED units 220 together forms the second cathode 222.

Specifically, the OLED array layer 200 further comprises pixel spacer layer 250 for defining pixel areas, the top-emitting OLED units 210 and the bottom-emitting OLED units 220 are formed in the pixel areas defined by the pixel spacer layer 250 correspondingly.

Specifically, the organic layer 203 comprises a hole injection layer, a hole transport layer, a light-emission layer, and electron injection/transport layer from the bottom up in a stack structure.

Specifically, the substrate 100 is a TFT array substrate, comprising a base substrate, and a TFT array layer disposed on the base substrate, wherein the TFT array layer comprises a plurality of TFT devices arranged in an array. Because the top-emitting OLED units 210 and the bottom-emitting OLED units 220 emit light facing away from and facing towards the substrate 100 respectively, the bottom-emitting OLED units 220 should be disposed in the non light-blocking areas of the substrate 100, while the top-emitting OLED units 210 can be disposed in the non light-blocking areas or light-blocking areas; for example, the top-emitting OLED units 210 can be disposed at the TFT devices, which usually do not allow light to transmit, so as to enhance the light-emitting area and pixel aperture ratio.

In the AMOLED double-sided display, the OLED array layer 200 comprises a plurality of top-emitting OLED units 210 and a plurality of bottom-emitting OLED units 220 arranged in an array, wherein the top emitting OLED units 210 and the bottom-emitting OLED units 220 are arranged alternatingly in at least one of the horizontal direction or vertical direction. As such, by designing an algorithm for a single IC to control image displaying, only a display panel and a control IC are sufficient to achieve double-sided displaying, and able to ensure an observer standing in front of the display panel will not see mirrored image or directional distorted image, as well as achieve low-cost and quality display result.

Figure 5:
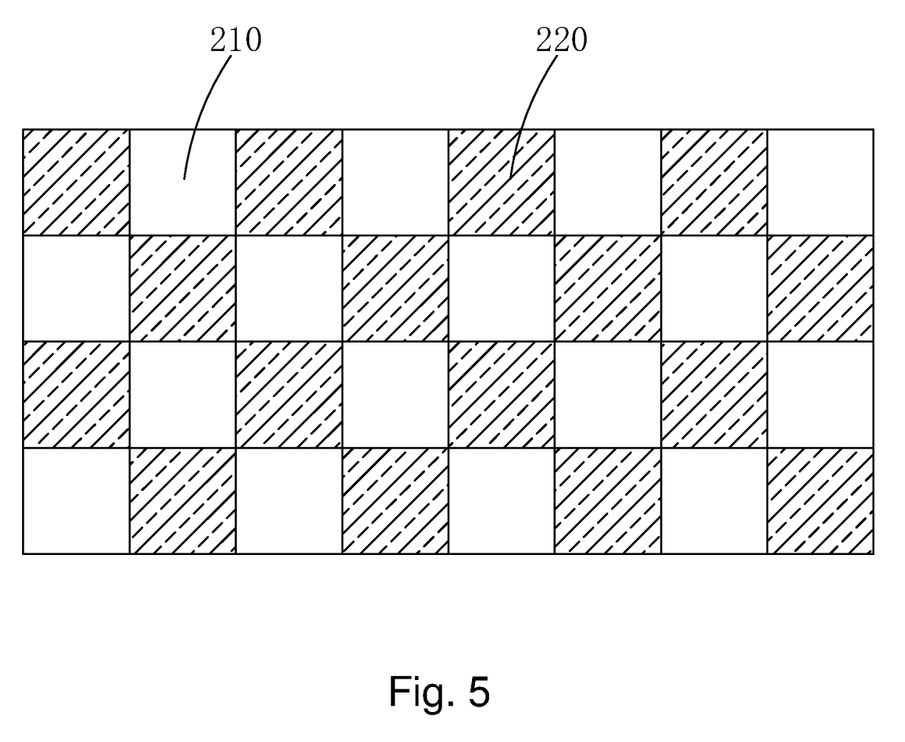
FIG. 5 is an enlarged view of the area A in FIG. 4 showing a first layout arrangement of the top-emitting OLED units and the bottom-emitting OLED units of the OLED array layer.

Specifically, as shown in FIG. 5, in the OLED array layer 200, the top-emitting OLED units 210 and the bottom-emitting units 220 are alternatingly arranged in both the horizontal and vertical directions; and the plurality of top-emitting OLED units 210 and the plurality of bottom-emitting OLED units 220 together form an OLED unit array, wherein the top-emitting OLED units 210 and the bottom-emitting OLED units 220 are arranged alternatingly in each row and each column.

In this case, by designing an algorithm for a single IC to control image displaying, only a display panel and a control IC are sufficient to achieve double-sided displaying, and able to ensure an observer standing in front of the display panel will not see mirrored image or directional distorted image, as well as achieve low-cost and quality display result. Specifically, the algorithm is as follows. During displaying, in the OLED unit array, for a positive integer i, the i-th top-emitting OLED unit 210 from left in each row receives the same image signal as the i-th bottom-emitting OLED unit 220 from right in the same row. For example, if the OLED unit array is an array of m rows and 2n columns, with both m and n positive integers. When the $1^{st}$, $2^{nd}$, $3^{rd}$, ..., n-th top-emitting OLED units 210, counting from left to right, of the first row receive image signals S11, S12, S13, ..., S1n, respectively, and the $1^{st}$, $2^{nd}$, $3^{rd}$, ..., n-th top-emitting OLED units 210, counting from left to right, of the second row receive image signals S21, S22, S23, . . . , S2n, respectively, then, the $1^{st}$, $2^{nd}$, $3^{rd}$, . . . , n-th bottom-emitting OLED units 220, counting from right to left, of the first row receive image signals S11, S12, S13, . . . , S1n, respectively, and the $1^{st}$, $2^{nd}$, $3^{rd}$, . . . , n-th bottom-emitting OLED units 220, counting from right to left, of the second row receive image signals S21, S22, S23, . . . , S2n, respectively. In other words, the i-th (counting from left to right) top-emitting OLED unit 210 of the j-th row receives an image signal Sji, and the i-th (counting from right to left) bottom-emitting OLED unit 220 of the j-th row receives an image signal Sji. As a result, by following the above algorithm, only a display panel and a control IC are sufficient to achieve double-sided displaying, and able to ensure an observer standing in front of the display panel will not see mirrored image or directional distorted image.

Figure 6:
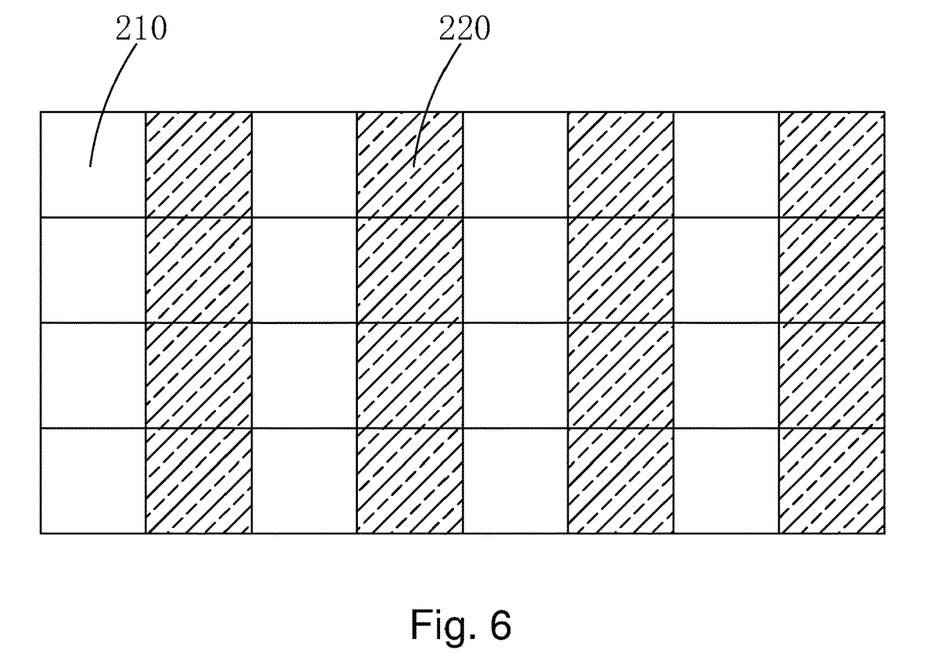
FIG. 6 is an enlarged view of the area A in FIG. 4 showing a second layout arrangement of the top-emitting OLED units and the bottom-emitting OLED units of the OLED array layer.

Alternatively, as shown in FIG. 6, in the OLED array layer 200, the top-emitting OLED units 210 and the bottom-emitting units 220 are alternatingly arranged in the horizontal direction but not in the vertical direction; and the plurality of top-emitting OLED units 210 and the plurality of bottom-emitting OLED units 220 together form an OLED unit array, wherein each odd-numbered column comprises the top-emitting OLED units 210 and each even-numbered column comprises the bottom-emitting OLED units 220; or, each odd-numbered column comprises the bottom-emitting OLED units 220 and each even-numbered column comprises the top-emitting OLED units 210.

Accordingly, the corresponding algorithm for single IC controlling image is as follows. During displaying, in the OLED unit array, for a positive integer i, the i-th top-emitting OLED unit 210 from left in each row receives the same image signal as the i-th bottom-emitting OLED unit 220 from right in the same row. For example, if the OLED unit array is an array of m rows and 2n columns, with both m and n positive integers. When the $1^{st}$, $2^{nd}$, $3^{rd}$, . . . , n-th top-emitting OLED units 210, counting from left to right, of the first row receive image signals S11, S12, S13, . . . , S1n, respectively, and the $1^{st}$, $2^{nd}$, $3^{rd}$, . . . , n-th top-emitting OLED units 210, counting from left to right, of the second row receive image signals S21, S22, S23, . . . , S2n, respectively, then, the $1^{st}$, $2^{nd}$, $3^{rd}$, . . . , n-th bottom-emitting OLED units 220, counting from right to left, of the first row receive image signals S11, S12, S13, . . . , S1n, respectively, and the $1^{st}$, $2^{nd}$, $3^{rd}$, . . . , n-th bottom-emitting OLED units 220, counting from right to left, of the second row receive image signals S21, S22, S23, . . . , S2n, respectively.

Figure 7:
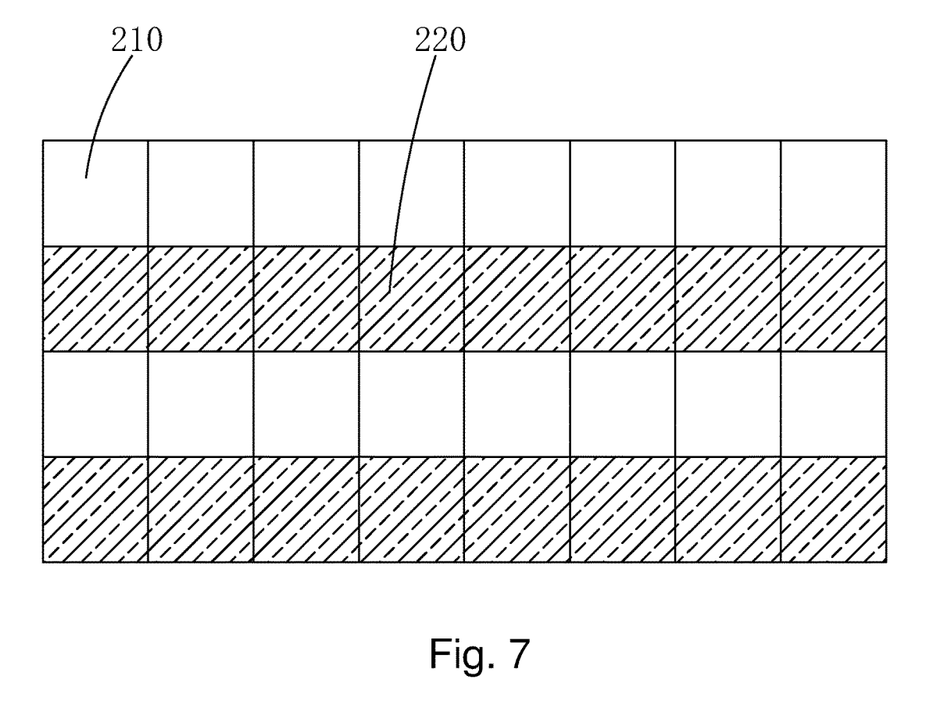
FIG. 7 is an enlarged view of the area A in FIG. 4 showing a third layout arrangement of the top-emitting OLED units and the bottom-emitting OLED units of the OLED array layer.

Or, as shown in FIG. 7, in the OLED array layer 200, the top-emitting OLED units 210 and the bottom-emitting units 220 are alternatingly arranged in the vertical direction but not in the horizontal direction; and the plurality of top-emitting OLED units 210 and the plurality of bottom-emitting OLED units 220 together form an OLED unit array, wherein each odd-numbered row comprises the top-emitting OLED units 210 and each even-numbered row comprises the bottom-emitting OLED units 220; or, each odd-numbered row comprises the bottom-emitting OLED units 220 and each even-numbered row comprises the top-emitting OLED units 210.

Accordingly, the corresponding algorithm for single IC controlling image is as follows. During displaying, in the OLED unit array 200, for positive integers i and j, the j-th top-emitting OLED unit 210 from top in the i-th column receives the same image signal as the j-th bottom-emitting OLED unit 220 from bottom in the i-th column. For example, if the OLED unit array is an array of 2m rows and n columns, with both m and n positive integers, and each odd-numbered row comprising top-emitting OLED units 210 while the even-numbered row comprising bottom-emitting OLED units 220. When the $1^{st}$, $2^{nd}$, $3^{rd}$, . . . , n-th top-emitting OLED units 210, counting from left to right, of the first row receive image signals S11, S12, S13, . . . , S1n, respectively, and the $1^{st}$, $2^{nd}$, $3^{rd}$, . . . , n-th top-emitting OLED units 210, counting from left to right, of the third row receive image signals S21, S22, S23, . . . , S2n, respectively, then, the $1^{st}$, $2^{nd}$, $3^{rd}$, . . . , n-th bottom-emitting OLED units 220, counting from right to left, of the second row receive image signals S11, S12, S13, . . . , S1n, respectively, and the $1^{st}$, $2^{nd}$, $3^{rd}$, . . . , n-th bottom-emitting OLED units 220, counting from right to left, of the fourth row receive image signals S21, S22, S23, . . . , S2n, respectively.

Figure 8:
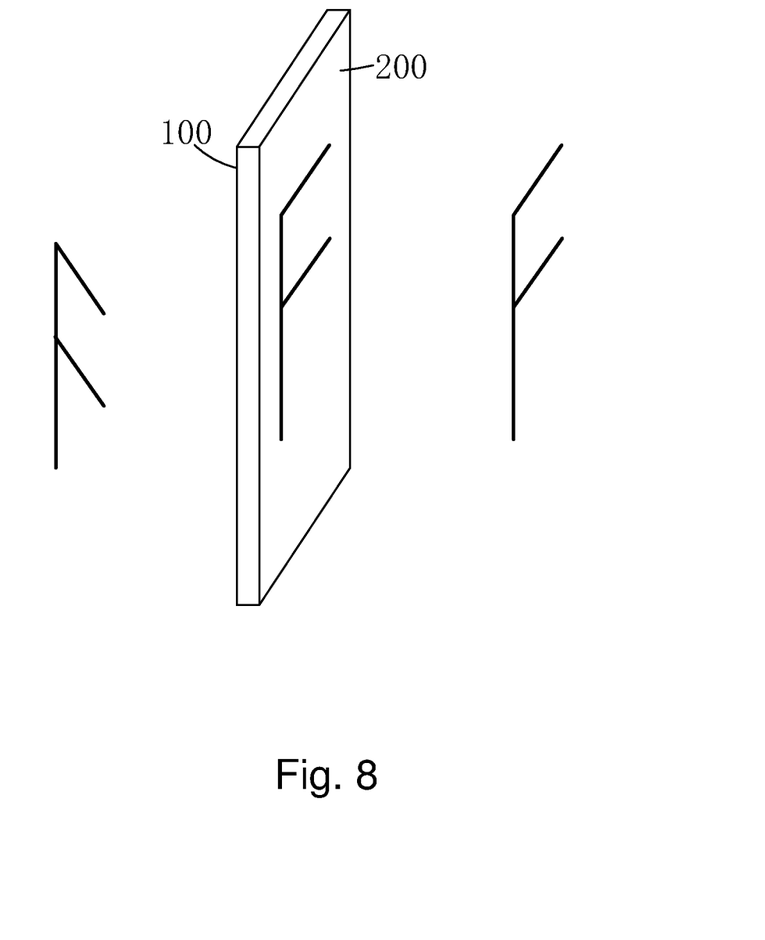
FIG. 8 is a schematic view showing the double-sided displaying effect of the AMOLED double-sided display provided by an embodiment of the present invention.

The AMOLED double-sided display of the present invention, by designing an algorithm for a single IC to control image displaying, requires only a display panel and a control IC to achieve double-sided displaying, and able to ensure an observer standing in front of the display panel will not see mirrored image or directional distorted image, as well as achieve low-cost and quality display result. As shown in FIG. 8, the observer standing on the right sees an F displayed on the AMOLED double-sided display, and the observer standing on the left also sees an F displayed on the AMOLED double-sided display.

In summary, the present invention provides an AMOLED doubled-sided display, comprising: a substrate, and an OLED array layer disposed on the substrate; the OLED array layer comprising a plurality of top-emitting OLED units arranged in an array, and a plurality of bottom-emitting OLED units arranged in an array, wherein the top emitting OLED units and the bottom-emitting OLED units being arranged alternatingly in at least one of the horizontal direction or vertical direction; the top-emitting OLED unit having an anode thicker than bottom-emitting OLED unit, and bottom-emitting OLED unit having a cathode thicker than the top-emitting OLED unit to increase the reflectivity of the anode of the top-emitting OLED unit and the cathode of the bottom-emitting OLED unit to realize the top-emitting characteristics of the top-emitting OLED units and the bottom-emitting characteristics of the bottom-emitting OLED units; as such, by designing an algorithm for a single IC to control image displaying, only a display panel and a control IC are sufficient to achieve double-sided displaying, and able to ensure an observer standing in front of the display panel will not see mirrored image or directional distorted image, as well as achieve low-cost and quality display result.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An active matrix organic light-emitting diode (AMOLED) doubled-sided display, which comprises: a substrate and an OLED array layer disposed on the substrate, the OLED array layer comprising a plurality of top-emitting OLED units and a plurality of bottom-emitting OLED units arranged in an array, wherein the plurality of top-emitting OLED units and the plurality of bottom-emitting OLED units are arranged alternately in a horizontal direction and a vertical direction;
   wherein each of the plurality of top-emitting OLED units comprises a first anode, an organic layer, and a first cathode arranged in a stacked structure and each of the plurality of bottom-emitting OLED units comprises a second anode, an organic layer, and a second cathode arranged in a stacked structure, the first anode being thicker than the second anode, the first anode being reflective and the second cathode being light-transmissive, wherein the second anode is formed of a first anode film that is transmissive to light and the first anode is formed of the first anode film and a second anode film located on the first anode film at a location corresponding to each of the plurality of the top-emitting OLED units, the second anode film being reflective and thicker than the first anode film; and
   the second cathode being thicker than the first cathode, the first cathode being light-transmissive and the second cathode being reflective;
   wherein the plurality of top-emitting OLED units and the plurality of bottom-emitting OLED units are alternate with each other in both the horizontal direction and the vertical direction such that each of the plurality of top-emitting OLED units is adjacent to one of the plurality of bottom-emitting OLED units in each of the horizontal direction and the vertical direction; and each of the plurality of bottom-emitting OLED units is adjacent to one of the plurality of top-emitting OLED units in each of the horizontal direction and the vertical direction.

2. The AMOLED double-sided display as claimed in claim 1, wherein the first anode and the second anode are formed respectively by two vacuum evaporation processes each of which is carried out with a mask.

3. The AMOLED double-sided display as claimed in claim 1, wherein the OLED array layer comprises a first cathode film and a second cathode film, and the second cathode film is formed on an upper surface of the first cathode film corresponding to the plurality of bottom-emitting OLED units by a vacuum evaporation process with a mask;
   the first cathode is formed by a part of the first cathode film corresponding to each of the plurality of top-emitting OLED units, and the second cathode is formed by a part of the first cathode film and the second cathode film corresponding to each of the plurality of bottom-emitting OLED units.

4. The AMOLED double-sided display as claimed in claim 1, wherein the plurality of top-emitting OLED units and the plurality of bottom-emitting OLED units together form an OLED unit array having rows and columns, wherein the plurality of top-emitting OLED units and the plurality of bottom-emitting OLED units are arranged alternately in each of the rows and each of the columns.

5. The AMOLED double-sided display as claimed in claim 4, wherein during displaying, in the OLED unit array, for a positive integer i, an i-th top-emitting OLED unit from left in each row of the rows receives a same image signal as an i-th bottom-emitting OLED unit from right in said each row of the rows.

6. An active matrix organic light-emitting diode (AMOLED) doubled-sided display, which comprises: a substrate and an OLED array layer disposed on the substrate, the OLED array layer comprising a plurality of top-emitting OLED units and a plurality of bottom-emitting OLED units arranged in an array, wherein the plurality of top-emitting OLED units and the plurality of bottom-emitting OLED units are arranged alternately in a horizontal direction and a vertical direction;
   wherein each of the plurality of top-emitting OLED units comprises a first anode, an organic layer, and a first cathode arranged in a stacked structure and each of the plurality of bottom-emitting OLED units comprises a second anode, an organic layer, and a second cathode arranged in a stacked structure, the first anode being thicker than the second anode, the first anode being reflective and the second cathode being light-transmissive, wherein the second anode is formed of a first anode film that is transmissive to light and the first anode is formed of the first anode film and a second anode film located on the first anode film at a location corresponding to each of the plurality of the top-emitting OLED units, the second anode film being reflective and thicker than the first anode film; and
   the second cathode being thicker than the first cathode, the first cathode being light-transmissive and the second cathode being reflective;
   wherein the plurality of top-emitting OLED units and the plurality of bottom-emitting OLED units are alternate with each other in both the horizontal direction and the vertical direction such that each of the plurality of top-emitting OLED units is adjacent to one of the plurality of bottom-emitting OLED units in each of the horizontal direction and the vertical direction; and each of the plurality of bottom-emitting OLED units is adjacent to one of the plurality of top-emitting OLED units in each of the horizontal direction and the vertical direction;
   wherein the first anode and the second anode being formed respectively by two vacuum evaporation processes each of which is carried out with a mask;
   wherein the OLED array layer comprises a first cathode film and a second cathode film, and the second cathode film being formed on an upper surface of the first cathode film corresponding to the plurality of bottom-emitting OLED units by a vacuum evaporation process with a mask;
   the first cathode being formed by a part of the first cathode film corresponding to each of the plurality of top-emitting OLED units, and the second cathode being formed by a part of the first cathode film and the second cathode film corresponding to each of the plurality of bottom-emitting OLED units.

7. The AMOLED double-sided display as claimed in claim 6, wherein the plurality of top-emitting OLED units and the plurality of bottom-emitting OLED units together form an OLED unit array having rows and columns, wherein the plurality of top-emitting OLED units and the plurality of bottom-emitting OLED units are arranged alternately in each of the rows and each of the columns.

8. The AMOLED double-sided display as claimed in claim 7, wherein during displaying, in the OLED unit array, for a positive integer i, an i-th top-emitting OLED unit from left in each row of the rows receives a same image signal as an i-th bottom-emitting OLED unit from right in said each row of the rows.

\* \* \* \* \*